United States Patent
Stegner

(10) Patent No.: US 9,954,507 B2
(45) Date of Patent: Apr. 24, 2018

(54) USING AVERAGED AUDIO MEASUREMENTS TO AUTOMATICALLY SET AUDIO COMPRESSOR THRESHOLD LEVELS

(71) Applicant: Adobe Systems Incorporated, San Jose, CA (US)

(72) Inventor: Matthew Gehring Stegner, Seattle, WA (US)

(73) Assignee: ADOBE SYSTEMS INCORPORATED, San Jose, CA (US)

( * ) Notice: Subject to any disclaimer, the term of this patent is extended or adjusted under 35 U.S.C. 154(b) by 14 days.

(21) Appl. No.: 15/225,625

(22) Filed: Aug. 1, 2016

(65) Prior Publication Data
US 2018/0034435 A1    Feb. 1, 2018

(51) Int. Cl.
*H03G 7/00*  (2006.01)
*H03G 9/00*  (2006.01)
*G06F 3/16*  (2006.01)
*G10L 21/14* (2013.01)

(52) U.S. Cl.
CPC ............. *H03G 9/005* (2013.01); *G06F 3/162* (2013.01); *G10L 21/14* (2013.01); *H03G 7/00* (2013.01)

(58) Field of Classification Search
CPC ....... H03G 7/007; H03G 9/005; H03G 3/3089
USPC .......................................................... 381/106
See application file for complete search history.

(56) References Cited

U.S. PATENT DOCUMENTS

| | | | | |
|---|---|---|---|---|
| 2007/0136062 A1* | 6/2007 | Braunschweiler | ...... | G10L 13/10 704/253 |
| 2011/0261968 A1* | 10/2011 | Yu | ........................ | H03G 3/3005 381/17 |
| 2012/0264481 A1* | 10/2012 | Gu | ...................... | H04M 1/6016 455/550.1 |
| 2013/0054251 A1* | 2/2013 | Eppolito | ................ | H03G 7/007 704/500 |

* cited by examiner

*Primary Examiner* — Nafiz E Hoque
(74) *Attorney, Agent, or Firm* — Wolfe-SBMC

(57) ABSTRACT

Various aspects of this disclosure describe setting an audio compressor threshold using averaged audio measurements. Examples include calculating one or more average values of amplitude values of an audio file, and setting a threshold used in the audio compressor based on the calculated thresholds. Samples of the audio file with amplitude values above the threshold are attenuated, while samples of the audio file with amplitude values below the threshold are not attenuated. The threshold can be set equal to a calculated average value, or from a function of one or more calculated average values. Different audio channels comprising the audio file can be processed to set a respective compressor threshold for each audio channel.

20 Claims, 5 Drawing Sheets

USING AVERAGED AUDIO MEASUREMENTS TO AUTOMATICALLY SET AUDIO COMPRESSOR THRESHOLD LEVELS

BACKGROUND

Digital audio workstations (DAWs), and their video equivalents, non-linear editors (NLEs), facilitate editing of audio files that have been previously recorded. A common editing technique used to set the dynamic range of an audio file involves passing the audio file through an audio compressor. The compressor is usually programmed with a threshold, and when processing an audio file, attenuates sections of the audio file with amplitudes above the threshold, while not attenuating sections of the audio file with amplitudes below the threshold.

Proper setting of the threshold of a compressor can take significant effort using conventional techniques. For example, trained audio engineers may listen to a section of audio multiple times to set the threshold. To do so, the trained audio engineers rely on amplitude of the audio displayed on audio meters and nuances in the perception of the audio that would be lost on neophytes. Additionally, in conventional techniques the trained audio engineer may be forced to repeat the process of setting the compressor threshold multiple times, starting over each time, and try different compressor threshold values for the audio file until the trained audio engineer is satisfied. These efforts often result in significant time expended.

Furthermore, proper setting of the compressor threshold can take significant training to achieve an acceptable result. For example, experience is required to understand how much audio compression will occur over the length of an audio file, and judge if there is too much or too little audio compression. For the novice user, who does not understand how to properly set the threshold of the compressor, the compressed result is almost always poor quality, because the novice user's lack of training usually results in little more than a blind guess at setting the compressor threshold.

SUMMARY

This Summary is provided to introduce a selection of concepts in a simplified form that are further described below in the Detailed Description. This Summary is not intended to identify key features or essential features of the claimed subject matter.

In some aspects, a method receives an audio file and instructions to automatically compress the audio file. Responsive to receiving the instructions, at least one average value of amplitude values of the audio file is calculated. Responsive to calculating at least one average value, at least one threshold is set based on at least one average value. For instance, a threshold may be set equal to an average value. Responsive to setting at least one threshold, the audio file is compressed by attenuating at least some samples of the audio file that have an amplitude above the at least one threshold and not scaling (e.g., attenuating or amplifying) at least some other samples of the audio file that have an amplitude below the threshold.

In other aspects, a system includes one or more processors. The system also includes hardware storing software that is executable by the one or more processors to perform operations, including receiving an audio file and instructions to automatically compress the audio file. Responsive to receiving the instructions, at least one average value of amplitude values of the audio file is calculated. For example, an average value may be calculated according to a root-mean-square (RMS). Responsive to calculating at least one average value, at least one threshold is set based on the at least one average value. Responsive to setting at least one threshold, the audio file is compressed by attenuating at least some samples of the audio file that have an amplitude above the at least one threshold and not scaling at least some other samples of the audio file that have an amplitude below the threshold.

In still other aspects, a device includes an input configured to receive an audio file. The device also includes an interface configured to receive instructions to automatically compress the audio file. For instance, instructions may be sent responsive to a user selection in a user interface, or as part of a default configuration and sent upon loading the audio file into an editor. The device also includes an average calculator module configured to calculate, responsive to receiving the instructions, at least one average value of amplitude values of the audio file. The device also includes a threshold setting module configured to set, responsive to calculating the average value, at least one threshold based on the at least one average value. The device also includes a compressor module configured to compress, responsive to the setting, the audio file by attenuating at least some samples of the audio file that have an amplitude above the at least one threshold and not scaling at least some other samples of the audio file that have an amplitude below the threshold.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF DRAWINGS

The detailed description references the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Overview

Digital audio workstations (DAWs), and their video equivalents, non-linear editors (NLEs), facilitate editing of audio files that have been previously recorded. An example of a DAW is Adobe's Audition CC, and examples of NLEs include Adobe's Premiere Pro CC and Apple's Final Cut Pro. An audio compressor is commonly used to set the dynamic range of the audio file. For instance, the dynamic range of an audio file can be reduced with an audio compressor so as to make the audio file generally be perceived as louder after gain is added to the resulting output of the audio compressor.

The compressor is usually programmed with a threshold, and when processing an audio file, the compressor attenuates samples of the audio file with amplitudes above the threshold. Samples below (or equal to) the threshold are typically not scaled in amplitude.

Conventionally, the threshold of a compressor is manually set, which can take significant time and effort by a trained audio engineer, who may listen and analyze a section of audio repeatedly until satisfied with the compression results. Furthermore, novice users without training and experience often manually set the threshold according to their best (and untrained) guess, yielding suboptimum compression results.

In contrast, techniques and systems are described to automatically set a threshold for an audio compressor based on averaging amplitude values of the audio file. This results in accurate and repeatable compression results that can be quickly and easily obtained, even by the novice user. The techniques are initiated in response to user instructions, such as by selecting an option in a user interface, or in response to loading the audio file into the DAW or NLE, as part of a default configuration. Once initiated, the techniques automatically calculate an average value of amplitude values of the audio file, set the threshold of an audio compressor based on the calculated average, and compress the audio file, without user intervention.

In the following discussion, an example system for setting an audio compressor threshold using averaged audio measurements is described. Techniques that elements of the example system may implement, interfaces for implementing the techniques, and a device on which elements of the example system and example interfaces may be embodied, are also described. Consequently, performance of the example procedures is not limited to the example system and the example system is not limited to performance of the example procedures. Any reference made with respect to the example system, or elements thereof, is by way of example only and is not intended to limit any of the aspects described herein.

Example Environment

Figure 1:
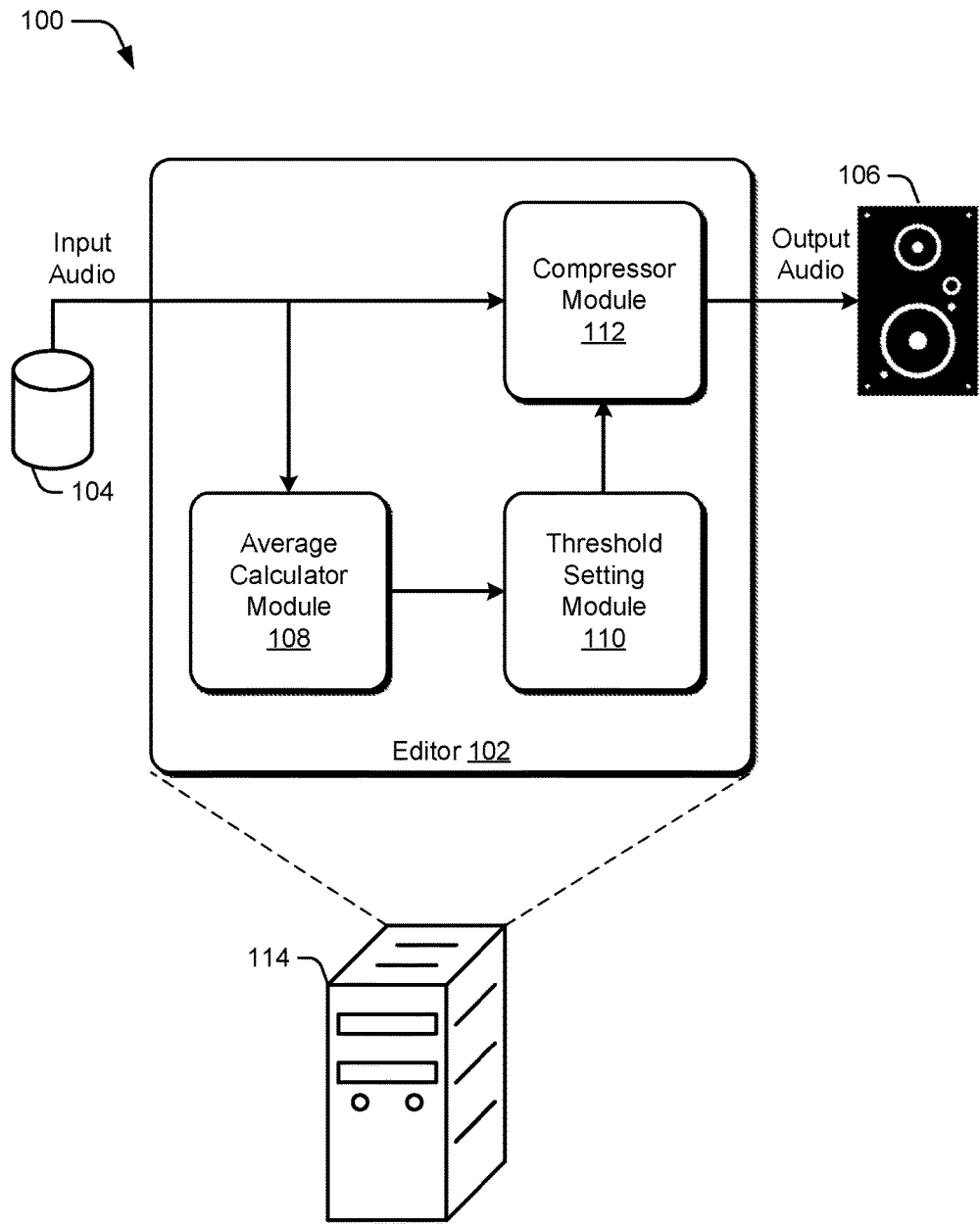
FIG. 1 illustrates an example system for compressing an audio file in accordance with one or more aspects of the disclosure.

FIG. 1 illustrates an example system 100 for compressing an audio file in accordance with one or more aspects of the disclosure. System 100 may comprise any suitable type of device or devices, such as a DAW, NLE, cellular phone, tablet, laptop computer, set-top box, satellite transceiver, cable television receiver, access point, desktop computer, gaming device, vehicle navigation system, cell tower, base station, cable head-end, and the like. Furthermore, system 100 may comprise any suitable type of implementation, including hardware, software, firmware, and combinations thereof. In addition, system 100 may be implemented with components on any suitable type of platform, such as an application-specific integrated circuit (ASIC), multiple die on multiple chips, multiple die on a single chip, a System-on-Chip (SoC), discrete components, general purpose processor, digital signal processor (DSP), combinations thereof, and the like.

System 100 includes an editor 102, file storage 104, and speaker 106. Editor 102 includes an average calculator module 108, threshold setting module 110, and compressor module 112. For simplicity's sake, the discussion of system 100 is reserved to these modules and devices. However, various embodiments can include additional modules, components, hardware, software and/or firmware without departing from the scope of the subject matter described herein. For example, such components not shown in FIG. 1 may include, but are not limited to, control logic, amplifiers, filters, interfaces, connectors, displays, and the like.

File storage 104 stores the input audio signal, usually via an audio file, and provides the input audio file to editor 102. For example, an audio file may adhere to an Audio Engineering Society (AES) format, or any other suitable format or standard, and be suitably stored on file storage 104. File storage 104 can include any suitable non-transitory computer-readable storage media, such as, by way of example and limitation, a disk, disc, tape, hard drive, thumb drive, card, combinations thereof, and the like. Furthermore, file storage 104 may comprise a same device as editor 102, such as computing device 114, and therefore be collocated with editor 102. Additionally or alternatively, file storage 104 can comprise a separate device from editor 102. For instance, file storage 104 may include a server that is located at a physical different location than editor 102. Accordingly, file storage 104 can provide input audio file to editor 102 via a network or networks (not shown).

The input audio file can include one or a plurality of audio channels, such as stereo (left and right channels), surround sound (more than two channels, five, six, or eight being common), or a plurality of mono channels (for instance, different speakers in an interview recorded on different audio channels). The input audio file contains digital samples of an audio signal or signals. The digital samples can be at any suitable bit width and at any suitable sample rate. As a non-limiting example, the input file includes stereo audio channels, each channel sampled at 44.1 KHz and represented by 16 bits per sample. Moreover, in some examples, an input audio file is part of a video, such as comprising one or more audio channels of a movie.

Editor 102 represents any suitable type of editor, such a DAW or NLE. Editor 102 is included in computing device 114. Computing device 114 can be any suitable type of computing device capable of including editor 102, such as, by way of example and not limitation, a workstation, desktop computer, laptop computer, tablet computer, smart phone, wearable computer, personal computer, server, and the like. Furthermore, though file storage 104 and loudspeaker 106 are illustrated as separate from computing device 114, computing device 114 can also include file storage 104, loudspeaker 106, or both file storage 104 and loudspeaker 106.

Editor 102 processes the input audio file and is configured to compress the input audio file using average calculator module 108, threshold setting module 110, and compressor module 112. Average calculator module 108 receives the input audio file, and calculates at least one average value of amplitude values of samples comprising the input audio file. Threshold setting module 110 receives the calculated average values from average calculator module 108 and sets at least one compression threshold based on the calculated average values received from average calculator module 108. Compressor module 112 receives the thresholds from threshold setting module 110 and the input audio file. Compressor module 112 includes at least one compressor. A compressor processes the input audio file by attenuating at least some samples of the audio file that have an amplitude above a threshold from threshold setting module 110 and not scaling at least some other samples of the audio file that have an amplitude below the threshold. The compressed audio from compressor module 112 is provided as output audio for consumption or further processing, such as for subsequent editing.

Subsequent editing may include performing another stage of compression by supplying the output audio signal to the input of system 100 and repeating the above-mentioned compression procedure with a previously-calculated or newly-calculated threshold. Consumption may include playback of the output audio file, such as rendering through loudspeaker 106. Though loudspeaker 106 is illustrated as a single loudspeaker, loudspeaker 106 can represent a plurality of loudspeakers, such as two, five, six, or eight loudspeakers. Furthermore, loudspeaker 106 can include a video display. In instances where the input audio file corresponds to a video, such as a motion picture, loudspeaker 106 can be configured to play the output audio file synchronized with the corresponding video signal displayed on a video display comprising loudspeaker 106.

Having considered a general discussion of the operation of system 100, consider now a discussion of average calculator module 108, threshold setting module 110, and compressor module 112 in greater detail.

Average Calculator Module

Average calculator module 108 calculates at least one average value of amplitude values of the input audio file. In response to instructions to automatically set a compressor threshold, average calculator module 108 scans the input audio file and calculates at least one average value. The scanning is performed faster than real time (e.g., much faster than the playback duration of the audio file), so average values are calculated with minimal or no delay perceived by the user. For instance, the scanning can be performed in the background with no interaction from the user. In one example, average calculator module 108 is configured to calculate a root-mean-square (RMS) average value of samples comprising the audio file according to $$RMS = \sqrt{\frac{1}{N}\sum x_i^2},$$

where $x_i$, i=0 . . . N−1, are samples of the input audio file. For example, an RMS average value can be calculated for the entire duration of the audio file, in which case, the $x_i$ represent the entire audio samples from the audio file. Alternatively or additionally, an average value can be calculated for less than all of the audio file. For instance, suppose an interviewer begins an interview with a race spectator at the start of a drag race. The first ten seconds or so of the interview, while the drag race is going on, may be much louder than speech of the spectator due to the sound of the race cars. In this instance, average calculator module 108 can be configured to omit a portion of the audio file containing the loud race cars, and to calculate an average value of amplitudes of remaining samples from the audio file, e.g., when the drag race is over and speech of the spectator can be heard.

Average calculator module 108 can also be configured to calculate an average value of amplitudes of samples comprising the input file periodically. For example, average calculator module 108 may scan the input file and divide the input file into a pre-determined number of contiguous blocks, and calculate an average value for each of the contiguous blocks. Alternatively or additionally, average calculator module 108 can be configured to calculate an average value every W seconds, for some pre-determined amount of time, W. The average calculated each W seconds can be a fresh average (e.g., calculated just from samples over the past W seconds), or a running average (e.g., calculated from all previous samples, since the beginning of the audio file). In addition, a user may specify which sections of the input audio file for which average calculator module 108 calculates an average value, such as by setting points in a audio time line and selecting regions using the set points, or any suitable fashion.

Furthermore, average calculator module 108 can be configured to calculate an average value for each audio channel comprising the input audio file. For instance, in an eight-channel surround sound recording, average calculator module 108 can be configured to calculate eight average values, one corresponding to each of the eight channels. Average calculator module 108 can also be configured to average other calculated average values. For example, suppose average calculator module 108 calculates average values for each of left and right channels comprising a stereo audio file. Average calculator module 108 can also calculate an average value of left and right channels by averaging the average values for each of left and right channels.

Moreover, average calculator module 108 can be configured to calculate a minimum average value, a maximum average value, and a middle average value. The minimum average value is set from a minimum of a plurality of average values calculated by average calculator module 108. The maximum average value is set from a maximum of a plurality of average values calculated by average calculator module 108. Similarly, the middle average value is set from a middle of a plurality of average values calculated by average calculator module 108, such as the median value or mean value of the plurality of average values. In one example, a user can designate the plurality of average values that are used in calculating the minimum average value, maximum average value, and middle average value, such as by setting appropriate options in a user interface. One option includes discarding at least the maximum average value and the minimum average value when calculating the middle average value.

Average calculator module 108 can also be further configured to calculate at least one average value by calculating a weighted average, with weights being determined from frequency content of the audio file. For example, a weighted RMS $$RMS = \sqrt{\frac{1}{N}\sum w_i \cdot x_i^2},$$

value can be calculated according to where $x_i$, i=0 . . . N−1, are samples of the input audio file, such as time-domain or frequency domain samples, and $w_i$ are adjustable weights determined from spectral content of the audio file. The adjustable weights can be set to de-emphasize low-frequency and high-frequency content, such as below 20 Hz and above 20 KHz, which correspond to frequency bands normally outside a person's hearing range.

Threshold Setting Module

Threshold setting module 110 receives the calculated average values from average calculator module 108 and in response, sets at least one compression threshold based on the calculated average values received from average calculator module 108. In one example, threshold setting module 110 receives an average value from average calculator module 108 that corresponds to the entire duration of the input file, and automatically sets a compressor threshold equal to the average value that corresponds to the entire duration of the input file. Alternatively or additionally, threshold setting module 110 is configured to set at least one threshold by applying at least one function to at least one average value received from average calculator module 108. This can be represented by $T=\varphi(a_k)$ where T is a threshold set in threshold setting module 110, $a_k$, k=1 . . . M, are one or more (e.g., M) average values from average calculator module 108, and $\varphi(\cdot)$ is an operator, such as a linear function or a non-linear function. For instance, threshold setting module 110 can be configured to apply a margin to an average value from average calculator module 108, such as by addition, multiplication, or both. As a non-limiting example, threshold setting module 110 receives an average value in dB from average calculator module 108 and adds 1 dB margin to the average value to set a threshold for compression. As another non-limiting example, operator $\varphi(\cdot)$ is a non-linear function that constrains the threshold to be set within a certain range. The range can be a single, contiguous range, or be the union of disjoint ranges.

Operator $\varphi(\cdot)$ may be implemented as an averaging function, and threshold setting module 110 is configured to set at least one threshold by averaging at least two average values received from average calculator module 108. For example, threshold setting module 110 can be configured to average the average values of left and right channels of a stereo file and use the result to set a threshold. As another example, threshold setting module 110 is configured to average a minimum RMS value and a middle RMS value from average calculator module 108 to set a threshold.

Threshold setting module 110 can also be configured to set a threshold for one channel of an audio file based on an average value corresponding to another channel of the audio file. For example, threshold setting module 110 can receive two average values from average calculator module 108 corresponding to average values of left and right channels of an audio file. Threshold setting module 110 can set the threshold to be used for compression of the left audio channel based on the average value of the right channel In this case, the threshold to be used for compression of the right audio channel is also based on the average value of the right channel, so that all channels are compressed using a threshold based on an average value of a single channel of the audio file from average calculator module 108. Similarly, a threshold for an eight-channel, surround-sound audio file can be set from the average value calculated for one of the eight channels, such as a center channel.

Threshold setting module 110 can also be configured to set a plurality of thresholds corresponding to a plurality of average values from average calculator module 108. For example, threshold setting module 110 can receive a plurality of average values, each corresponding to a different audio channel of the input audio file. Threshold setting module 110 can set a different threshold for each of the different audio channels. For example, each threshold may be based on the corresponding average value of the audio channel by biasing a function of the average values towards that audio channel or simply setting the threshold for a channel to the corresponding average value for that channel In one example, threshold setting module 110 sets a threshold for each calculated average value provided from average calculator module 108.

Threshold setting module 110 may also be configured to set a single threshold to be used for compression of all audio channels comprising the input audio file. Alternatively, as described above, threshold setting module 110 sets a different threshold to be used for compression of all audio channels comprising the input audio file. Furthermore, threshold setting module 110 can be configured to set more than one threshold, but less than the number of audio channels comprising the audio input file. For instance, some audio channels may share a threshold, while other audio channels require a dedicated threshold be set by threshold setting module 110. The determination for audio channels to share a threshold can be made automatically by the threshold setting module 110. For example, if the magnitude of the difference between average values from average calculator module 108 for a group of audio channels is below a specified amount, threshold setting module 110 can automatically set a common compression threshold for these audio channels. This may be performed by selecting one of the average values of these channels as the compression threshold to be shared between the group of audio channels.

Compressor Module

Compressor module 112 receives one or more thresholds from threshold setting module 110, and also receives the input audio file. Compressor module 112 includes at least one audio compressor. An audio compressor (or compressor for short) is used to reduce the dynamic range of the audio file. Reducing the dynamic range of an audio file can be desirable to make the audio appear louder to a listener, or to properly mix one audio track with another audio track.

At least one threshold from threshold setting module 110 is used to control a compressor implemented by the compressor module 112. The compressor processes the input audio file by attenuating at least some samples of the audio file that have an amplitude above a threshold from threshold setting module 110. One threshold can be used for the entire duration of the audio file, or a plurality of thresholds can be used for compressing a single audio file, one after another throughout the duration of the audio file. Usually, a compressor does not attenuate, or otherwise scale samples of the audio file that have an amplitude below the threshold being used by the compressor.

Compressor module 112 can also include a plurality of audio compressors. Multiple audio compressors can simultaneously process multiple audio channels. Alternatively or additionally, a single audio compressor comprising compressor module 112 can process multiple audio channels in an interleaved fashion, one channel after another channel. Accordingly, compressor module 112 can supply a compressed output audio file in any suitable fashion, such as with different audio channels separated by block address in the output file, or interleaved in the output file.

An audio compressor is also characterized by (i) attack time, (ii) release time, (iii) make-up gain, and (iv) compression ratio. Attack time refers to how quickly the compressor engages, usually measured in milliseconds, and release time refers to how quickly the compressor disengages, usually also measured in milliseconds. Make-up gain refers to how much gain is applied to the audio file after compression, and the compression ratio refers to how much attenuation is applied to audio samples above the threshold. In one example, compressor module 112 automatically sets one or more of these four compressor parameters based on a threshold received from threshold setting module 110. A threshold, for instance, may be compared to ranges of thresholds in compressor module 112, and depending on what range the threshold falls in, a compression ratio corresponding to that range may be selected. When the threshold is judged to be in a low range, a smaller compression ratio can be selected, to prevent over compressing the signal. When the threshold is judged to be in a high range, a higher compression ratio can be selected, to prevent under compressing the signal. Similarly, depending on what range the threshold falls in, a make-up gain corresponding to that range can be selected to properly set the overall gain of the audio file. Thus, average values of amplitude values of the audio file can be used to set compressor parameters other than just the threshold of compression.

In addition to comprising audio compressors, compressor module 112 can also include one or more noise gates. A noise gate is similar to a compressor, but instead of attenuating audio samples with amplitudes above a threshold like a compressor, a noise gate attenuates audio samples with amplitudes less than the threshold. Noise gates are useful in an audio file recorded with background noise. For example, a noise gate can be used to attenuate background noise in a stadium where a sports figure is interviewed. When the sports figure is speaking, the background noise of the stadium is dominated by the speech. However, during times without speech, the background noise of the stadium dominates. By using a noise gate with a threshold set above the background noise level, but below the speech level, the dynamic range of the audio file can be improved, resulting in a better perceived listening experience.

One or more thresholds from threshold setting module 110 can be used in compressor module 112 to set a threshold for a noise gate. Samples of the file having an amplitude below the threshold are attenuated by the noise gate. However, samples of the file having an amplitude above the threshold are not attenuated or otherwise scaled by the noise gate. The noise gate can be configured analogously as described above for the audio compressor, and process one or more audio channels using one or more thresholds received from threshold setting module 110. Thus, it is to be understood and appreciated that comments made for audio compressors herein are to be interpreted as similarly applying to noise gates.

In an example, compressor module 112 is configured to operate a noise gate using a threshold set by averaging a minimum RMS value and a middle RMS value.

Having considered a discussion of example system 100 for compressing an audio file, consider now a discussion of an example user interface.

Figure 2:
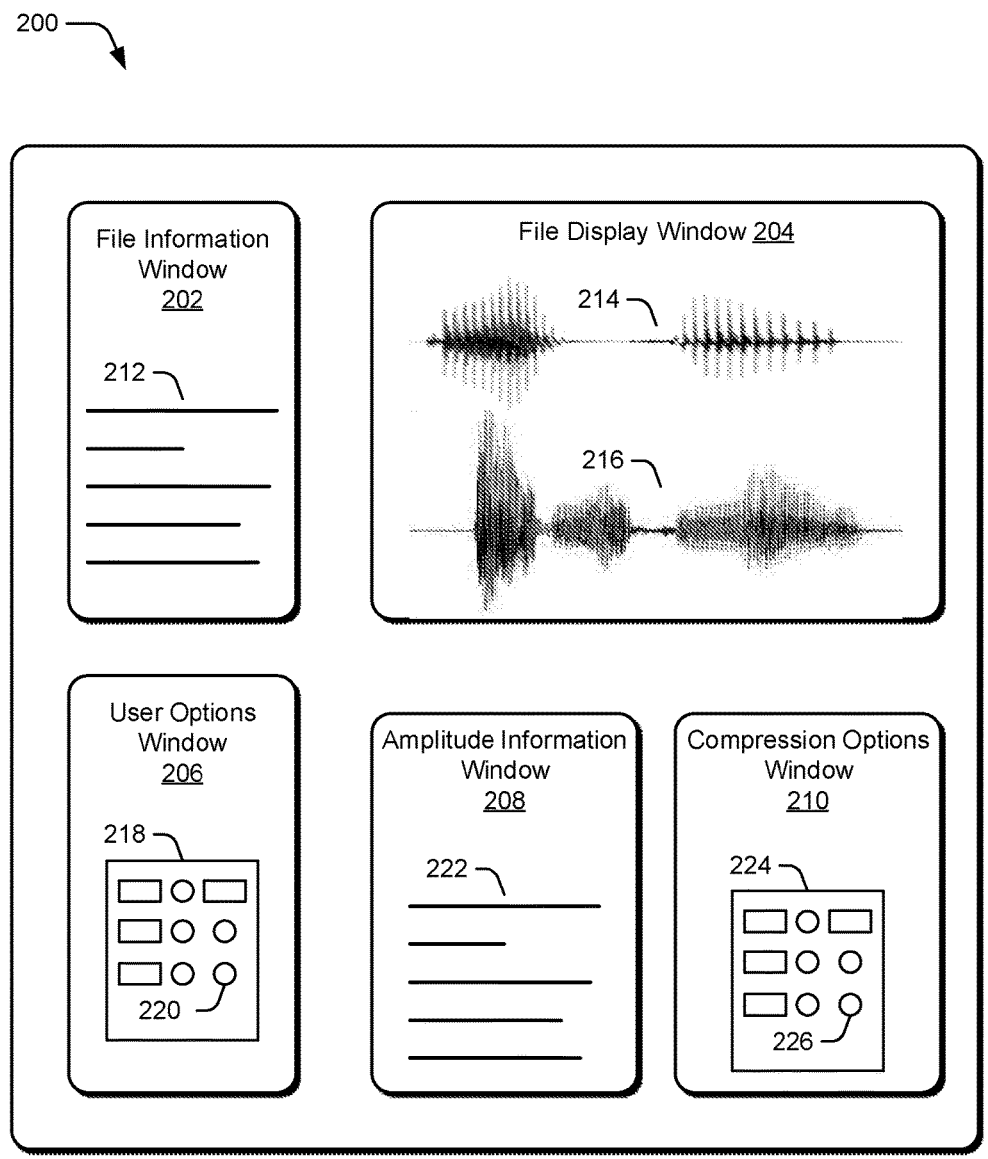
FIGS. 2-3 illustrate example user interfaces in accordance with one or more aspects of the disclosure.

FIG. 2 illustrates example user interface 200 in accordance with one or more aspects of the disclosure. User interface 200 supports user interaction with system 100 in FIG. 1. For example, user interface 200 can be an interface to a DAW or NLE used to compress audio files. User interface 200 contains multiple windows, including file information window 202, file display window 204, user options window 206, amplitude information window 208, and compression options window 210. For simplicity's sake, the discussion of user interface 200 is reserved to these windows. However, various embodiments can include additional windows without departing from the scope of the subject matter described herein. For example, such windows not shown in FIG. 2 may include, but are not limited to, tool bars, task bars, clocks, mixers, effects windows, timeline windows, video display windows, and the like.

Furthermore, though the windows in FIG. 2 are illustrated in a convenient arrangement for clarity, any suitable arrangement of windows is possible. For example, a user may select and drag any window to relocate the window within user interface 200. Though the windows are illustrated as not overlapping, a user may move a window and cause it to overlap another window. By selecting a particular window, such as with a left click, or right click which opens selectable tabs with an option to select the window, the user can cause the selected window to be brought to the front of user interface 200 so it can be viewed unblocked by another window.

File information window 202 displays information about the audio file currently loaded, generally shown at information 212 as horizontal lines, for example representing text. Information 212 can include a variety of details about the audio file, such as by way of example and not limitation, the audio file name, how many audio channels include the audio file, dates the audio file was recorded, mixed, and/or licensed, equipment used to record the audio file, sampling rate and bit width of audio data in the audio file, indication of dithering in the sampling process, number of tracks and duration of tracks in the audio file, performing and/or authoring artists of the audio file, and the like.

File display window 204 displays at least one graphical representation of the audio file. For example, file display window 204 is illustrated in FIG. 2 containing two representations 214 and 216. Representations 214 and 216 can graphically display any suitable type of representation of data in the audio file, including time domain data (such as sample amplitudes versus time), frequency domain data (such as a spectrograph), time-frequency distributions in three dimensions (such as a Wigner distribution), combinations thereof, and the like.

Though two representations are illustrated for clarity in FIG. 2, any suitable number of representations can be displayed in file display window 204. For example, a five-channel audio file may display five representations, one for each audio channel of the audio file.

User options window 206 displays options for a user to interact with the audio file, generally shown at options 218 as a collection of rectangles and circles representing sliders, buttons, tabs, switches, and the like which a user may select, adjust and otherwise use to process the audio file. Options 218 can include a variety of control options for interacting with the audio file, such as by way of example and not limitation, noise reduction, volume control, filter application (such as a high pass or low pass filter), hard limiter, resampler, and the like.

Figure 3:
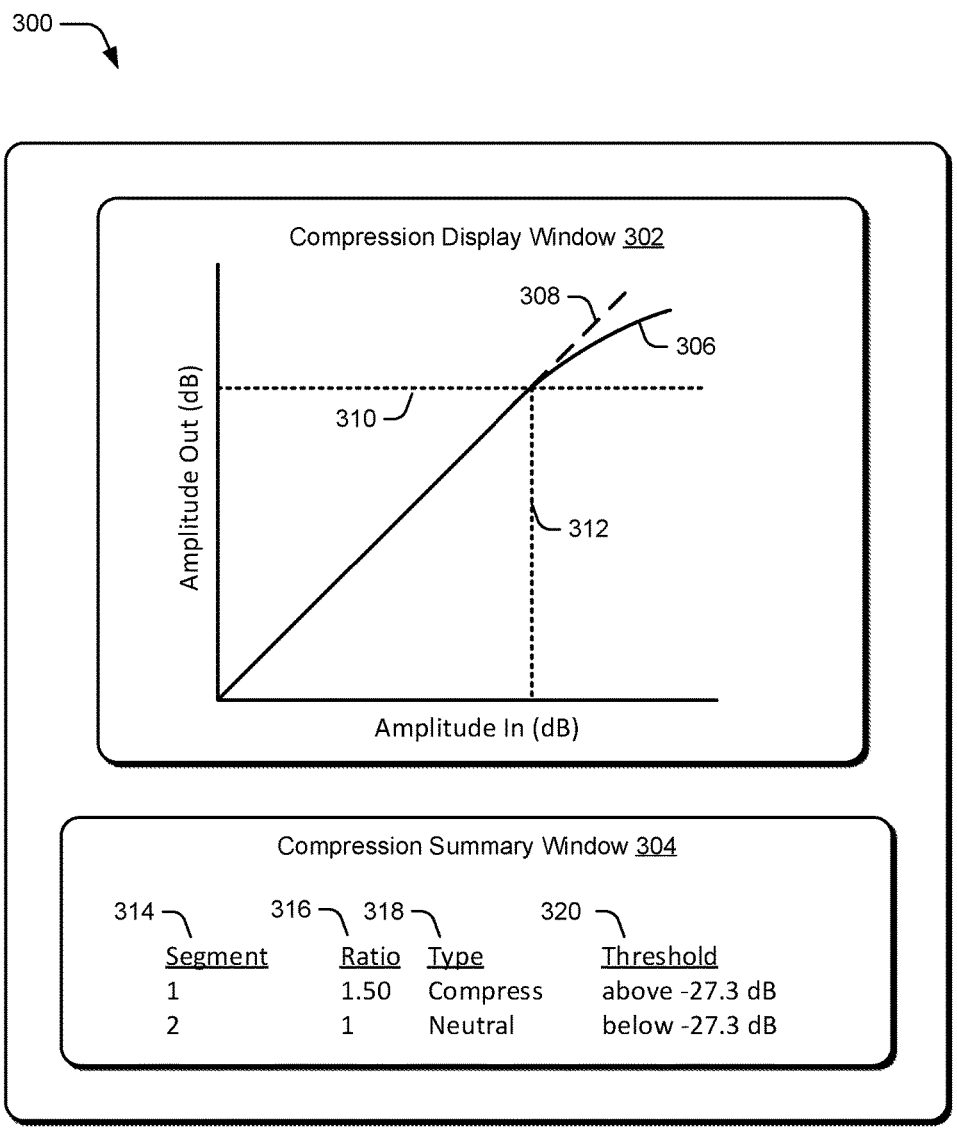

Options 218 includes user option 220. User option 220 can be selected by a user to cause instructions to be sent to initiate automatic setting of an audio compressor threshold using averaged audio measurements of the audio file, such as by system 100. User option 220 can be any suitable type of option, such as a button. Furthermore, user option 220 can be a multi-purpose option capable of being selected in different ways that result in different actions. A first method of selection can cause the audio file to be automatically compressed, while a second method of selection can cause intermediate windows to be displayed requiring confirmation before automatically compressing the audio file. For example, a user can hover a mouse over user option 220 and by left-clicking the mouse, can cause instructions to be sent so that amplitude information window 208 and compression options window 210 are made viewable to the user if these windows were previously not viewable to the user. Instead of left-clicking, by right-clicking the mouse, the user can cause instructions to be sent for the audio file to be automatically compressed using an average value of amplitude values of the audio file to determine a threshold of compression, such as by system 100, and cause user interface 300 in FIG. 3 to be displayed. User interface 300 in FIG. 3 shows results of automatically compressing the audio file using an average value of amplitude values of to determine a threshold of compression, and will be discussed below shortly.

Returning to FIG. 2, by selecting user option 220 in some suitable fashion, such as by left-clicking a mouse while hovering over user option 220, a user causes instructions to be sent that cause amplitude information window 208 and compression options window 210 to be made viewable. Amplitude information window 208 displays statistics about the input audio file, generally shown at statistics 222 as horizontal lines, for example representing text. Statistics 222 can include a variety of statistics of the input audio file resulting from scanning the audio file faster than real time, such as by way of example and not limitation, average values of amplitude values of samples of the audio file (e.g., calculated by average calculator module 108 in FIG. 1), peak amplitude values, maximum, minimum, and average sample values, DC offset, dynamic range, measured bit depth, loudness, and the like. Statistics 222 can be displayed separately for each channel of the audio file, and/or in summary for the entire audio file (considering all audio channels). Statistics 222 can be useful to the user for setting a threshold of compression to be used for the audio file. For example, the user can study statistics 222 reported from scanning the audio file and, based on the statistics, decide to apply a function to one of the average values reported in statistics 222 and use the result of the function as an audio compressor threshold.

Compression options window 210 displays compression options for a user to select or set for compressing the input audio file, generally shown at compression options 224 as a collection of rectangles and circles representing sliders, buttons, tabs, switches, and the like which a user may select, adjust and otherwise set to configure at least one audio compressor. Compression options 224 can include a variety of control options for configuring audio compressors for compressing audio channels comprising the input audio file, such as by way of example and not limitation, averaging options to further average a plurality of average values to set a threshold, functions that can be applied to an average value to set a threshold, such as a linear function that adds margin to an average value, compression ratio, attack time, release time, make-up gain, number of times to repeat compression, number and value of compression thresholds to use during an audio file, and the like. For instance, a user may analyze statistics 222 in amplitude information window 208 and set a number and value of compressor thresholds accordingly using compression options 224 in compression options window 210.

Compression options 224 also contains compression option 226. Compression option 226 can be selected by a user to cause instructions to be sent to initiate automatic compressing of the input audio file, such as by system 100 using compression options set in compression options window 210. Compression option 226 can be any suitable type of option, such as a button, and can be selected in any suitable fashion, such as by clicking a mouse while hovering over compression option 226. When compression option 226 is selected, instructions are sent to system 100. Responsive to receiving the instructions, the audio file is automatically compressed, and user interface 300 in FIG. 3 is displayed. In an example, compression option 226 is a one-action option (e.g., enabled with a single click) to use an average value reported in amplitude information window 208 as a threshold and automatically initiate compressing the audio file according to the threshold.

FIG. 3 illustrates example user interface 300 in accordance with one or more aspects of the disclosure. User interface 300 shows results of compressing an input audio file, such as by system 100 in FIG. 1, in response to selecting user option 220 or compression option 226 in FIG. 2, or as part of a default configuration without user interaction. User interface 300 includes compression display window 302 and compression summary window 304. Compression display window 302 graphically illustrates compression curve 306, showing amplitude out (in dB) of the audio compressor versus amplitude in (in dB) to the audio compressor. For reference, curve 308 illustrated as a straight, dashed line indicates no attenuation, or equivalently, 1:1 compression ratio. Compression display window 302 also illustrates output gain 310 and threshold level 312 as dotted lines. Output gain 310 illustrates the output amplitude for an input amplitude equal to the threshold level 312 used by the audio compressor (and indicated in compression summary window 304). Therefore, for input amplitudes greater than the threshold, output amplitudes are attenuated according to the compression ratio. Compression curve 306 thus falls below linear curve 308 in this region where input amplitudes are greater than the threshold.

Compression summary window 304 displays summary results of compressing the audio file using a threshold based on an average value of amplitude values of the input audio file. Compression summary window 304 includes a segment indicator 314 that indicates the compression curve is broken into segments. In the indicated example, segment indicator 314 indicates first and second segments are designated. Multiple (e.g., more than two) segments can be defined, with two being illustrated for clarity.

Compression summary window 304 also includes a ratio indicator 316 that indicates attenuation in each of the segments designated by segment indicator 314. In the indicated example, ratio indicator 316 indicates attenuation by a factor of 1.50 in the first segment, and no attenuation in the second segment, so that the compression ratio is 1.50:1.

Compression summary window 304 also includes a type indicator 318 that indicates a type of processing in each of the segments designated by segment indicator 314. In the indicated example, type indicator 318 indicates the first segment is compressed, and the second segment is neutral, which is consistent with the compression ratio of 1.50:1 designated in ratio indicator 316.

Compression summary window 304 also includes a threshold indicator 320 that indicates a threshold above and below which the segments are defined. In the indicated example, threshold indicator 320 indicates that above a threshold of −27.3 dB corresponds to the first segment, and below the threshold of −27.3 dB corresponds to the second segment. Since multiple segments can be defined, multiple thresholds can be used to construct compression curve 306. For example, though only two segments and one threshold are used to construct compression curve 306 in the illustrated example, generally P segments and P−1 thresholds can be used to construct compression curve 306, for integer P>2.

User interface 300 can also include a user option or options (not shown) to repeat processing by the audio compressor. For example, the original audio file or the compressed audio file can be selected as input to the processor, scanned to calculate average values, and compressor thresholds can be set based on the calculated average values. Compressor thresholds used in subsequent stages of compression can be the same as or different from compressor thresholds used in previous stages of compression.

User interface 300 in FIG. 3 and user interface 200 in FIG. 2 are non-limiting example user interfaces. Though user interface 300 in FIG. 3 is shown separately from user interface 200 in FIG. 2, the interfaces can be combined into a single interface, split into a plurality of interfaces, or merged into an interface or interfaces in any suitable fashion.

Having considered a discussion of example user interfaces, consider now a discussion of example methods for setting a threshold of compression.

Example Procedure

Figure 4:
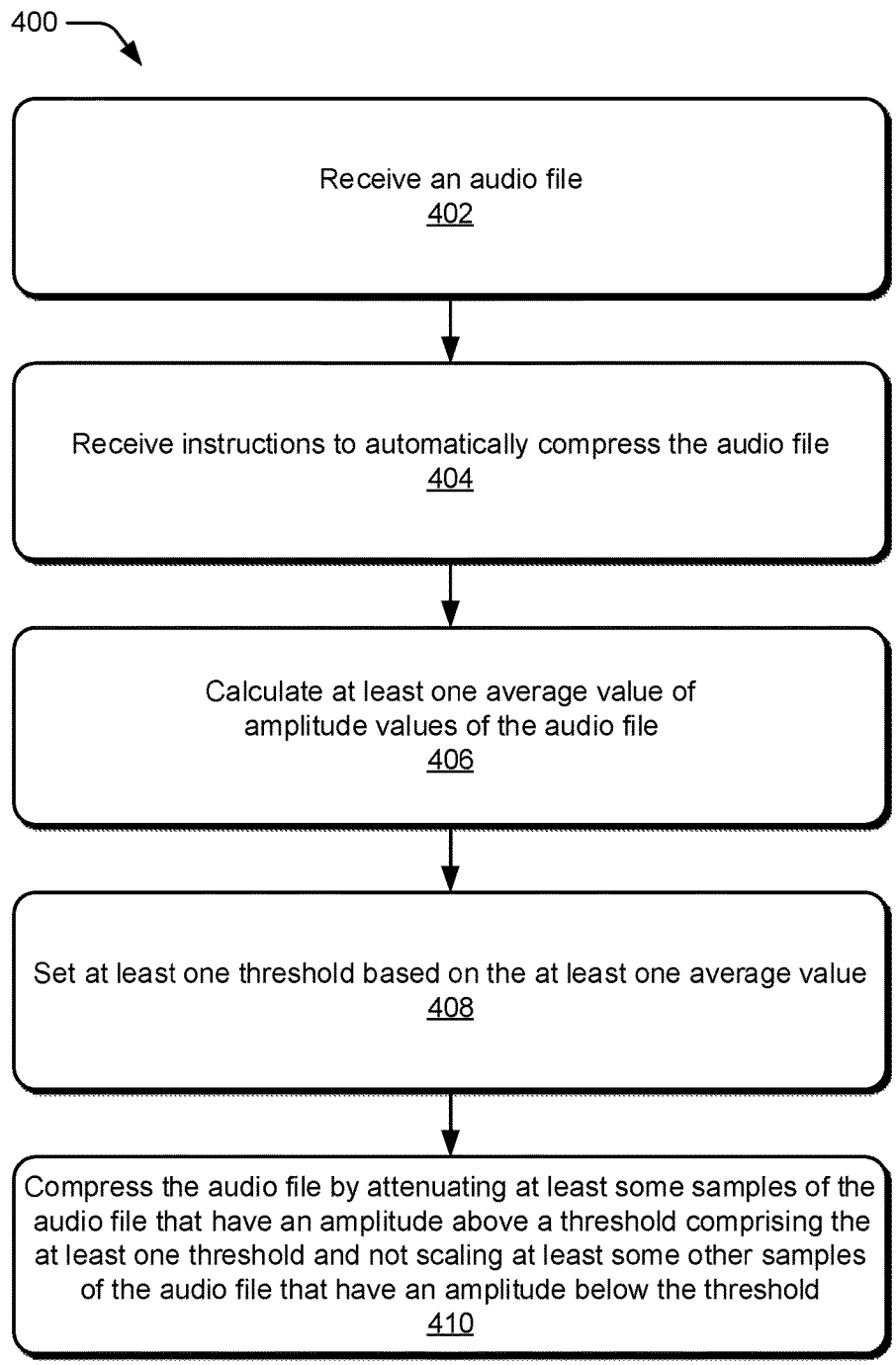
FIG. 4 illustrates an example method for setting a threshold of compression in accordance with one or more aspects of the disclosure.

FIG. 4 illustrates an example procedure 400 for setting a threshold of compression in accordance with one or more aspects of the disclosure. Aspects of the procedure may be implemented in hardware, firmware, software, or a combination thereof. The procedure is shown as a set of blocks that specify operations performed by one or more devices and are not necessarily limited to the orders shown for performing the operations by the respective blocks. In at least some embodiments the procedure may be performed by a suitably configured device or devices, such as a device or devices comprising the example system 100 described in FIG. 1 (e.g., average calculator module 108, threshold setting module 110, and compressor module 112).

An audio file is received (block 402). For example, an audio file may be loaded into a DAW or NLE, such as via user interface 200, and in response to the file being loaded, instructions can be sent to automatically initiate compressing the audio file. The audio file can represent one or more audio channels, can be stand-alone audio, or accompany a video track, such as comprising a soundtrack for a movie.

Instructions are received to automatically compress the audio file (block 404). For example, the instructions can be received responsive to the audio file being received, such as part of a default configuration that sends instructions to automatically compress the audio file once the audio file is loaded. Alternatively, the instructions can be received responsive to a user selection in a user interface, such as user selection of user option 220 or compression option 226 in FIG. 2.

At least one average value of amplitude values of the audio file is calculated (block 406). The average values can be calculated responsive to receiving the instructions at block 404. The average values are calculated by scanning the audio file faster than real time. One or more average values can be calculated for each audio channel comprising the audio file. Furthermore, the average values can be calculated automatically and without user intervention, such a responsive to instructions sent in response to the audio file being loaded into an editor.

At least one threshold is set based on the at least one average value (block 408). The thresholds can be set automatically and without user intervention, responsive to the averages being calculated at block 406. Alternatively or additionally, the thresholds can be set responsive to user interaction with the calculated average values. For example, a user may further average, add margin to a calculated average value, or apply a function to a calculated average value using compression options 224 in FIG. 2 to set a threshold. Thresholds set at block 408 can be used for audio compressors or noise gates in a DAW or NLE.

The audio file is compressed by attenuating at least some samples of the audio file that have an amplitude above a threshold comprising the at least one threshold and not scaling at least some other samples of the audio file that have an amplitude below the threshold (block 410). The audio file can be compressed automatically and without user intervention, responsive to a threshold being calculated at block 408. Alternatively or additionally, the audio file can be compressed responsive to user interaction, such as user selection of user option 220 or compression option 226 in FIG. 2. The audio file can be compressed using a single threshold for the entire duration of the audio file, or different thresholds for different corresponding sections of the audio file.

Some or all operations of example procedure 400 can be repeated to compress an audio file multiple times. For example, a compressed audio file can be generated according to procedure 400, and compression can be repeated by attenuating at least some samples of the compressed audio file that have an amplitude above a different threshold calculated at block 406 than the threshold used to generate the compressed audio file. Other samples of the compressed audio file that have an amplitude below the different threshold are not scaled or attenuated.

Having considered a discussion of example methods for setting a threshold of compression, consider now a discussion of an example device having components through which aspects of setting an audio compressor threshold using averaged audio measurements can be implemented.

Figure 5:
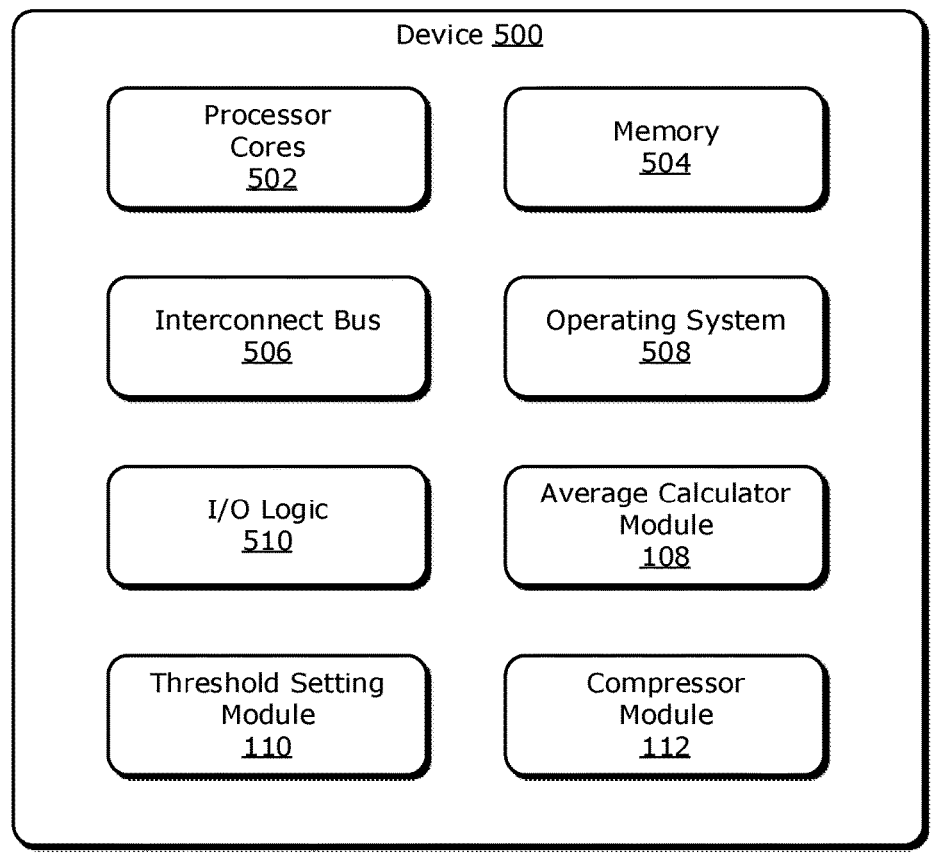
FIG. 5 illustrates a device having components through which aspects of setting an audio compressor threshold using averaged audio measurements can be implemented in accordance with one or more aspects of the disclosure.

FIG. 5 illustrates an example device 500, which includes components capable of implementing aspects of setting an audio compressor threshold using averaged audio measurements. Device 500 may be implemented as, or in, any suitable electronic device, such as a workstation, editor, cellular phone, smart-phone, gaming device, laptop computer, net book, desktop computer, server, cell tower, satellite, cable head-end, and/or any other device that may compress an audio file.

Device 500 may be integrated with a microprocessor, storage media, I/O logic, data interfaces, logic gates, a transmitter, a receiver, circuitry, firmware, software, and/or combinations thereof to provide communicative or processing functionalities. Device 500 may include a data bus (e.g., cross bar or interconnect fabric) enabling communication between the various components of the device. In some aspects, components of device 500 may interact via the data bus to implement aspects of setting an audio compressor threshold using averaged audio measurements.

In this particular example, device 500 includes processor cores 502 and memory 504. Memory 504 may include any suitable type of memory, such as volatile memory (e.g., DRAM), non-volatile memory (e.g., flash), cache, and the like. In the context of this disclosure, memory 504 is implemented as a storage medium, and does not include transitory propagating signals or carrier waves. Memory 504 can store data and processor-executable instructions of device 500, such as operating system 508 and other applications. Processor cores 502 may execute operating system 508 and other applications from memory 504 to implement functions of device 500, the data of which may be stored to memory 504 for future access. For example, processor cores may switch control functions to configure charge pump circuits. Memory 504 may also include file storage 104 in FIG. 1, capable of storing an input audio file or files.

Device 500 may also include I/O logic 510, which can be configured to provide a variety of I/O ports or data interfaces for communication. For example, I/O logic 510 can be configured to provide a graphical user interface, such as user interface 200 in FIG. and user interface 300 in FIG. 3. Accordingly, I/O logic 510 can include a display, such as a display for playback of video signals, and a loudspeaker, such as loudspeaker 106 in FIG. 1, for playback of audio files.

Device 500 also includes average calculator module 108, threshold setting module 110, and compressor module 112. Device 500 is configurable to connect average calculator module 108, threshold setting module 110, and compressor module 112 to form a system the same as, or substantially similar to, system 100 in FIG. 1. Device 500 is therefore configurable to calculate at least one average of amplitude values of an input audio file, set at least one compressor threshold based on the average value or values, and compress the input audio file using the compressor threshold or thresholds to produce a compressed audio file.

In one or more exemplary embodiments, the functions described may be implemented in hardware, software, firmware, or any combination thereof. If implemented in software, functions may be stored on a computer-readable storage medium (CRM). In the context of this disclosure, a computer-readable storage medium may be any available medium that can be accessed by a general-purpose or special-purpose computer that does not include transitory propagating signals or carrier waves. By way of example, and not limitation, such media can include RAM, ROM, EEPROM, CD-ROM or other optical disk storage, magnetic disk storage, or other magnetic storage devices, or any other non-transitory medium that can be used to carry or store information that can be accessed by a general-purpose or special-purpose computer, or a general-purpose or special-purpose processor. The information can include any suitable type of data, such as computer-readable instructions, sampled signal values, data structures, program components, or other data. These examples, and any combination of storage media and/or memory devices, are intended to fit within the scope of non-transitory computer-readable media. Disk and disc, as used herein, includes compact disc (CD), laser disc, optical disc, digital versatile disc (DVD), floppy disk and Blu-ray disc where disks usually reproduce data magnetically, while discs reproduce data optically with a laser. Combinations of the above should also be included within the scope of computer-readable media.

Firmware components include electronic components with programmable memory configured to store executable instructions that direct the electronic component how to operate. In some cases, the executable instructions stored on the electronic component are permanent, while in other cases, the executable instructions can be updated and/or altered. At times, firmware components can be used in combination with hardware components and/or software components.

The term "component", "module", and "system" are indented to refer to one or more computer related entities, such as hardware, firmware, software, or any combination thereof, as further described above. At times, a component may refer to a process and/or thread of execution that is defined by processor-executable instructions. Alternately or additionally, a component may refer to various electronic and/or hardware entities.

Certain specific embodiments are described above for instructional purposes. The teachings of this disclosure have general applicability, however, and are not limited to the specific embodiments described above.

What is claimed is:

1. A method of automatically compressing an audio signal on a computing device, the method comprising:
   receiving, by the computing device, an audio file;
   calculating, by the computing device in response to the audio file being loaded into an audio editing application on the computing device, at least one average value of amplitude values of the audio file, the at least one average value including a minimum average value and a maximum average value;
   setting, by the computing device, at least one threshold based on the at least one average value by averaging the minimum average value and the maximum average value to determine the at least one threshold; and
   compressing, by the computing device, the audio file by attenuating at least some samples of the audio file that have an amplitude above the at least one threshold and not scaling at least some other samples of the audio file that have an amplitude below the at least one threshold.

2. The method as recited in claim 1, wherein the calculating the at least one average value comprises calculating a root-mean-square (RMS) value.

3. The method as recited in claim 1, wherein the audio file represents a plurality of audio channels, and the at least one average value comprises an average value for each of the plurality of audio channels.

4. The method as recited in claim 1, wherein the calculating of the at least one average value comprises calculating an average value across an entire duration of the audio file.

5. The method as recited in claim 1, further comprising scanning the audio file by the computing device faster than real time, and using results of the scanning for the calculating the at least one average value.

6. The method as recited in claim 1, wherein the at least one average value comprises a plurality of average values, the at least one threshold comprises a plurality of thresholds, and the compressing uses a different threshold from among the plurality of thresholds for corresponding different parts of the audio file.

7. The method as recited in claim 1, further comprising receiving instructions to initiate automatic compression of the audio file responsive to a user selection in a user interface of the computing device.

8. The method as recited in claim 1, further comprising receiving instructions to initiate automatic compression of the audio file as part of a default configuration comprising the computing device.

9. A system for automatically compressing an audio signal, the system comprising:
   one or more processors; and
   hardware storing software that is executable by the one or more processors to perform operations including:
   receiving an audio file;
   discarding a maximum amplitude value and a minimum amplitude value for the audio file;
   calculating at least one average value of amplitude values of the audio file without including the discarded maximum amplitude value and the discarded minimum amplitude value;
   setting at least one threshold based on the at least one average value;
   comparing the at least one threshold to ranges of thresholds;
   setting a compression ratio based on a range of thresholds the at least one threshold belongs according to the comparing; and
   compressing the audio file by attenuating according to the compression ratio at least some samples of the audio file that have an amplitude above the at least one threshold and not scaling at least some other samples of the audio file that have an amplitude below the at least one threshold.

10. The system as recited in claim 9, wherein the audio file represents a stereo audio signal, the at least one average value comprises an average value for each channel of the stereo audio signal, and the at least one threshold comprises a threshold based on an average of the average values for each channel of the stereo audio signal.

11. The system as recited in claim 9, wherein the calculating of the at least one average value comprises calculating an average for less than all of the audio file.

12. The system as recited in claim 9, further comprising repeating the compressing by attenuating at least some samples of the compressed audio file that have an amplitude above another threshold and not scaling at least some other samples of the compressed audio file that have an amplitude below the another threshold.

13. The system as recited in claim 9, wherein the setting the at least one threshold is performed by adding a margin to the at least one average value.

14. The system as recited in claim 9, wherein the calculating, the setting the at least one threshold, the comparing, the setting the compression ratio, and the compressing are done without user interaction.

15. The system as recited in claim 9, wherein the at least one average value includes a minimum average value and a maximum average value, and the setting the at least one threshold includes averaging the minimum average value and the maximum average value to determine the at least one threshold.

16. A device for automatically compressing an audio signal, the device comprising:
an input configured to receive an audio file;
an average calculator module configured to calculate at least one average value of amplitude values of the audio file, the at least one average value including a first average value for a first audio channel and a second average value for a second audio channel;
a threshold setting module configured to set at least one threshold to approximate the at least one average value by:
determining a magnitude of a difference between the first average value and the second average value is below a specified amount; and
setting a common threshold for the first audio channel and the second audio channel; and
a compressor module configured to compress the audio file by attenuating at least some samples of the audio file that have an amplitude above the at least one threshold and not scaling at least some other samples of the audio file that have an amplitude below the at least one threshold.

17. The device as recited in claim 16, wherein the audio file represents a plurality of audio channels, the compressor module comprises a plurality of compressors, and each compressor is configured to compresses a different audio channel using a corresponding different threshold.

18. The device as recited in claim 16, wherein the average calculator module is further configured to calculate the at least one average value by calculating a weighted average with weights being determined from frequency content of the audio file.

19. The device as recited in claim 16, wherein the audio file represents a plurality of audio channels, the at least one average value comprises an average value for each of the plurality of audio channels, the at least one threshold comprises a plurality of thresholds corresponding to the plurality of audio channels, and a threshold corresponding to one audio channel is based on an average value of a different audio channel.

20. The device as recited in claim 16, wherein the at least one threshold includes a plurality of thresholds, and the threshold setting module is further configured to set one or more of the plurality of thresholds based on averaging at least two average values comprising the at least one average value of amplitude values.

* * * * *